(12) United States Patent
Han et al.

(10) Patent No.: US 11,907,469 B2
(45) Date of Patent: Feb. 20, 2024

(54) DISPLAY DEVICE

(71) Applicant: LG Display Co., Ltd., Seoul (KR)

(72) Inventors: Sungsu Han, Goyang-si (KR); HwiDeuk Lee, Gumi-si (KR); Yangsik Lee, Seoul (KR); JuHong Kim, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/963,869

(22) Filed: Oct. 11, 2022

(65) Prior Publication Data

US 2023/0214047 A1 Jul. 6, 2023

(30) Foreign Application Priority Data

Dec. 31, 2021 (KR) .................. 10-2021-0193997

(51) Int. Cl.
| | |
|---|---|
| *G06F 3/041* | (2006.01) |
| *G06F 3/044* | (2006.01) |
| *H10K 59/40* | (2023.01) |
| *H10K 59/124* | (2023.01) |

(52) U.S. Cl.
CPC ........ *G06F 3/04164* (2019.05); *G06F 3/0412* (2013.01); *G06F 3/0443* (2019.05); *H10K 59/124* (2023.02); *H10K 59/40* (2023.02); *G06F 2203/04111* (2013.01)

(58) Field of Classification Search
None
See application file for complete search history.

(56) References Cited

U.S. PATENT DOCUMENTS

| | | | |
|---|---|---|---|
| 2014/0375911 A1* | 12/2014 | Lee ...................... | G02F 1/13338 349/12 |
| 2016/0098113 A1 | 4/2016 | Ding et al. | |
| 2017/0192571 A1* | 7/2017 | Kim .................. | G02F 1/133345 |
| 2020/0020747 A1* | 1/2020 | Bok .................... | H10K 59/1213 |
| 2020/0027929 A1* | 1/2020 | Lee ....................... | G06F 3/0412 |

FOREIGN PATENT DOCUMENTS

| | | | | |
|---|---|---|---|---|
| CN | 104346010 A | * | 2/2015 | ............. G06F 3/044 |
| KR | 10-1679977 B1 | | 11/2016 | |
| KR | 10-2082265 B1 | | 2/2020 | |
| WO | WO-2019000520 A1 | * | 1/2019 | ............. G06F 3/041 |

* cited by examiner

*Primary Examiner* — Duane N Taylor, Jr.
(74) *Attorney, Agent, or Firm* — Birch, Stewart, Kolasch & Birch, LLP

(57) ABSTRACT

A display device can include a substrate in which a plurality of pixels each including an emissive area and a transmissive area is disposed. The display device can further include a touch electrode in the transmissive area, and a plurality of first touch connection lines extended in a first direction and electrically connecting the touch electrodes respectively disposed in the pixels adjacent to each other. Further, the display device can include a reference line on the substrate in the emissive area and extended in a second direction different from the first direction, and a plurality of touch lines extended in the second direction in the emissive area and disposed on a plurality of insulating layers covering the reference line. Furthermore, the display device can include a planarization layer covering the plurality of touch lines, and a plurality of light emitting diodes on the planarization layer in the emissive area.

19 Claims, 8 Drawing Sheets

DISPLAY DEVICE

CROSS-REFERENCE TO RELATED APPLICATIONS

This application claims priority to Korean Patent Application No. 10-2021-0193997 filed on Dec. 31, 2021 in the Republic of Korea, the entire contents of which are hereby expressly incorporated by reference into the present application.

BACKGROUND

Field

The present disclosure relates to a display device, and more particularly, to a display device in which an in-cell touch structure can be implemented.

Description of the Related Art

With the advent of the information age, display technology for visually displaying electrical information signals is under rapid development. Accordingly, efforts to decrease the volume, weight and power consumption of various display devices have been made.

Some of these display devices provide a touch-based input type that enables a user to easily input information or commands intuitively and conveniently, apart from a conventional input type using buttons, a keyboard, a mouse, or the like.

The touch-based display device can be roughly classified into a self-capacitance type and a mutual-capacitance type.

A self-capacitance type display device in which a capacitance is formed between a plurality of touch electrodes and a user's input recognizes a touch based on a change in capacitance generated at the time of a touch by the user. A mutual-capacitance type display device in which touch electrodes are divided into a driving electrode and a sensing electrode and a mutual capacitance is formed between them recognizes a touch based on a change in a mutual capacitance generated at the time of a touch by the user.

SUMMARY OF THE DISCLOSURE

An object to be achieved by the present disclosure is to provide a display device having an in-cell touch structure.

Another object to be achieved by the present disclosure is to provide a transparent display device.

Objects of the present disclosure are not limited to the above-mentioned objects, and other objects, which are not mentioned above, can be clearly understood by those skilled in the art from the following descriptions.

According to an aspect of the present disclosure, the display device can include a substrate in which a plurality of pixels each including an emissive area and a transmissive area is disposed. Also, the display device includes a touch electrode in the transmissive area. Further, the display device includes a plurality of first touch connection lines extended in a first direction and electrically connecting the touch electrodes respectively disposed in the plurality of pixels adjacent to each other. Furthermore, the display device includes a reference line on the substrate in the emissive area and extended in a second direction different from the first direction. Moreover, the display device includes a plurality of touch lines extended in the second direction in the emissive area and disposed on a plurality of insulating layers covering the reference line. Further, the display device includes a planarization layer covering the plurality of touch lines. Furthermore, the display device includes a plurality of light emitting diodes on the planarization layer in the emissive area. The touch electrode is disposed on the planarization layer, and the plurality of first touch connection lines is disposed under the planarization layer.

Other detailed matters of the exemplary embodiments are included in the detailed description and the drawings.

According to the present disclosure, it is possible to implement a display device having an in-cell structure by a simple process with small cost.

According to the present disclosure, a touch electrode can be made of a transparent conductive material. Thus, it is possible to implement a transparent display device.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1:
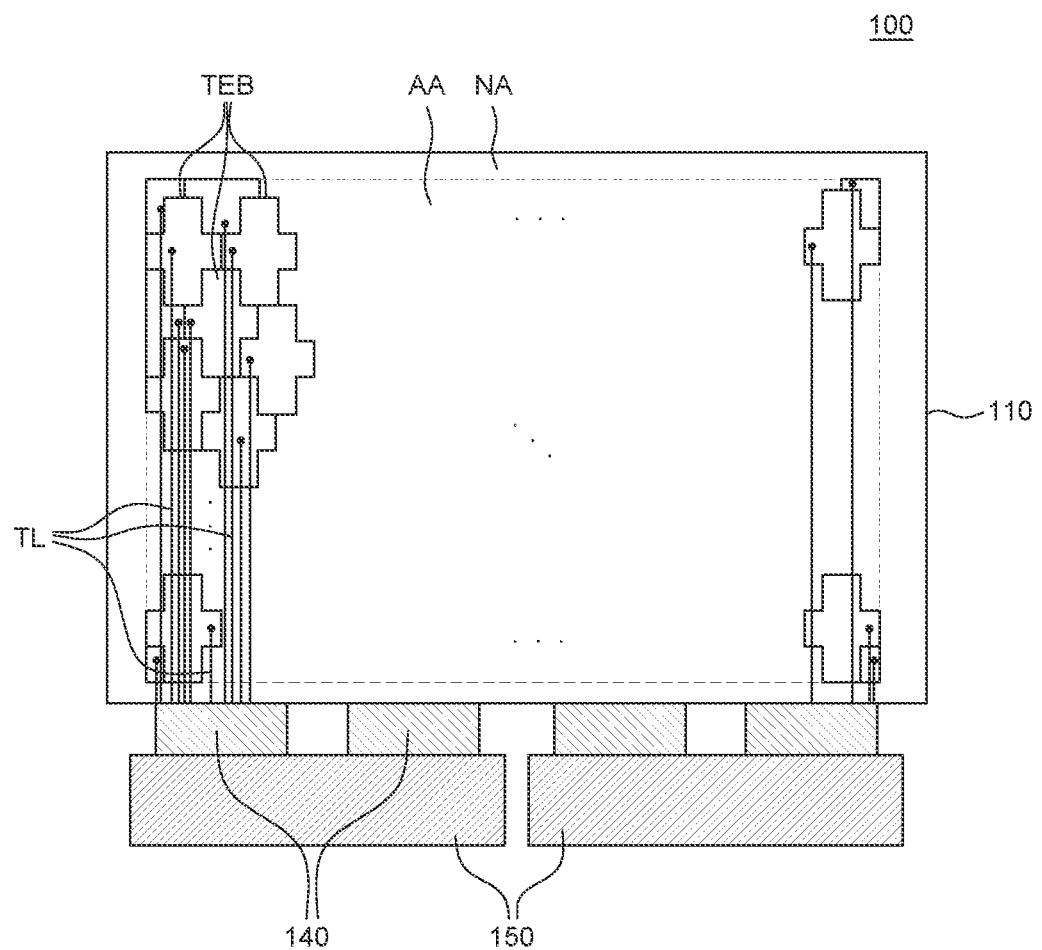
FIG. 1 is a plan view illustrating a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies can be omitted to avoid unnecessarily obscuring the subject matter of the present disclosure. The terms such as "including," "having," and "consist of" used herein are generally intended to allow other components to be added unless the terms are used with the term "only". Any references to singular can include plural unless expressly stated otherwise.

Components are interpreted to include an ordinary error range even if not expressly stated.

When the position relation between two parts is described using the terms such as "on", "above", "below", and "next", one or more parts can be positioned between the two parts unless the terms are used with the term "immediately" or "directly".

When an element or layer is disposed "on" another element or layer, another layer or another element can be interposed directly on the other element or therebetween.

Although the terms "first", "second", and the like are used for describing various components, these components are not confined by these terms. These terms are merely used for distinguishing one component from the other components. Therefore, a first component to be mentioned below can be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, the present disclosure will be described in detail with reference to accompanying drawings. All the components of each display device according to all embodiments of the present disclosure are operatively coupled and configured.

Figure 2:
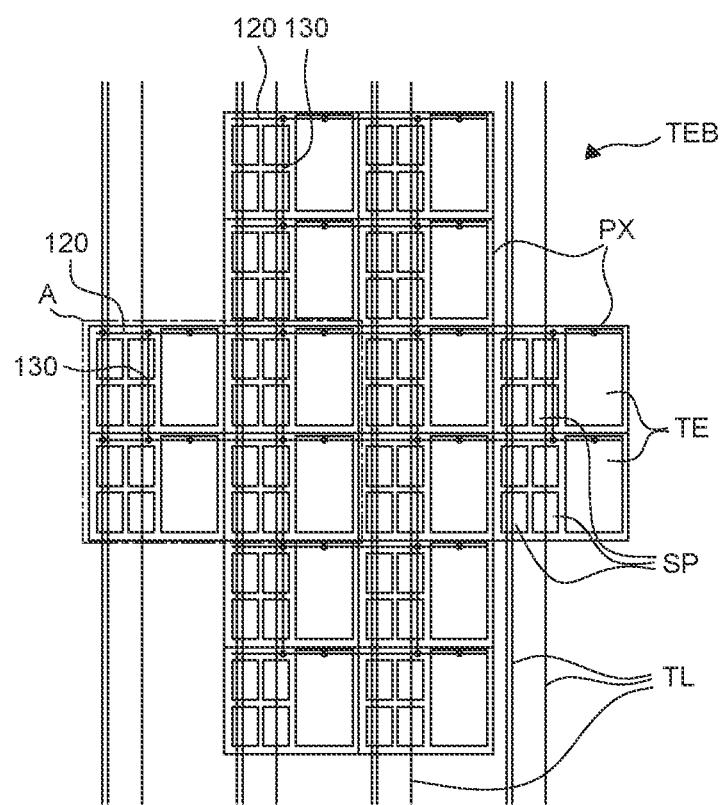
FIG. 2 is a configuration diagram of a touch electrode block shown in FIG. 1.

FIG. 1 is a plan view illustrating a display device according to an exemplary embodiment of the present disclosure. FIG. 2 is a configuration diagram of a touch electrode block shown in FIG. 1.

In FIG. 1 and FIG. 2, for the convenience of description, a substrate 110, a plurality of touch lines TL, a plurality of first touch connection lines 120, a plurality of second touch connection lines 130, a plurality of flexible films 140 and a plurality of printed circuit boards 150 among various components of a display device 100 are illustrated.

Referring to FIG. 1 and FIG. 2, the display device 100 according to an exemplary embodiment of the present disclosure includes the substrate 110, the plurality of touch lines TL, the plurality of first touch connection lines 120, the plurality of second touch connection lines 130, the plurality of flexible films 140 and the plurality of printed circuit boards 150. The display device 100 can be a transparent display device having an in-cell touch structure.

The substrate 110 is a substrate for supporting and protecting various components of the display device 100. The substrate 110 can be made of glass or a plastic material having flexibility. When the substrate 110 is made of a plastic material, the substrate 110 can be made of, for example, polyimide (PI), but is not limited thereto.

The substrate 110 includes a display area AA including a plurality of touch electrode blocks TEB and a non-display area NA outside the display area AA. Each touch electrode block TEB includes a plurality of pixels PX. Also, in each of the plurality of pixels PX, a plurality of sub-pixels SP and a touch electrode TE can be disposed. FIG. 2 illustrates that each touch electrode block TEB is composed of 16 pixels, but the present disclosure is not limited thereto.

The plurality of sub-pixels SP can be an area where an image is actually implemented as light is emitted. Each sub-pixel SP is a minimum unit for forming an image, and the plurality of sub-pixels SP can emit light of different wavelengths. For example, the plurality of sub-pixels SP can include a red sub-pixel, a green sub-pixel, a blue sub-pixel and a white sub-pixel. For example, a single pixel PX can include four sub-pixels SP emitting light of different colors. However, the present disclosure is not limited thereto.

Each of the plurality of sub-pixels SP can include a light emitting diode MED that emits light and a driver circuit for driving the light emitting diode OLED. The driver circuit can include a switching transistor, a driving transistor, a capacitor, a line, and the like. The plurality of sub-pixels SP can be electrically connected to a plurality of gate lines disposed in a first direction and a plurality of data lines disposed in a second direction different from the first direction. Herein, the first direction can be a horizontal direction shown in FIG. 1 and FIG. 2, and the second direction can be a vertical direction shown in FIG. 1 and FIG. 2, but may not be limited thereto. The driver circuit can be electrically connected to a gate driver integrated circuit (IC) and a data driver integrated circuit (IC) disposed in the non-display area NA through signal lines such as gate lines and data lines.

In the pixel PX, the touch electrode TE is disposed in an area where the plurality of sub-pixels SP is not disposed. The touch electrode TE can be made of a transparent conductive material. Accordingly, the area where the touch electrode TE is disposed can have transparency. The touch electrode TE can be electrically connected to a touch line TL and can transmit and receive a touch driving signal or a touch sensing signal to and from a touch driver integrated circuit (IC).

A plurality of touch electrodes TE disposed in a single touch electrode block TEB can be electrically connected to each other. For example, a touch electrode block TEB can refer to a group of a plurality of touch electrodes TE electrically connected to each other. The plurality of touch electrodes TE disposed in the single touch electrode block TEB can be electrically connected to each other through a first touch connection line 120 and a second touch connection line 130. The first touch connection line 120 can be a line disposed in the first direction, and the second touch connection line 130 can be a line disposed in the second direction. The first touch connection line 120 and the second touch connection line 130 will be described later with reference to FIG. 3 through FIG. 4B.

The touch electrode block TEB can be configured having a cross shape. However, the present disclosure is not limited thereto. For example, the shape of the touch electrode block TEB can vary depending on the design of the display device 100.

The plurality of touch electrode blocks TEB can be electrically connected to the plurality of touch lines TL, respectively. The plurality of touch electrode blocks TEB can receive a touch driving signal through the plurality of touch lines TL and recognize a touch. Also, the plurality of touch electrode blocks TEB can transmit a touch sensing signal to the plurality of touch lines TL. The plurality of touch electrode blocks TEB can recognize a touch by a self-capacitance type method.

The plurality of touch lines TL can be disposed in the second direction. The plurality of touch lines TL can be disposed to overlap with the plurality of sub-pixels SP. The number of touch lines TL passing through a single pixel PX can be set to three, but is not limited thereto. The touch electrode block TEB can be electrically connected to any one of the plurality of touch lines TL passing through the touch electrode block TEB. For example, as shown in FIG. 2, the touch electrode block TEB can be electrically connected to the touch line TL disposed on the leftmost side, but is not limited thereto. Also, the touch line TL can be electrically connected to the plurality of touch electrodes TE through the first touch connection line 120 and the second touch connection line 130 within the touch electrode block TEB.

The non-display area NA is disposed in a circumferential area of the substrate 110 and can be an area where an image is not displayed. In the non-display area NA, various components for driving the sub-pixels SP and the touch electrode TE disposed in the display area AA can be disposed. For example, a driver integrated circuit (IC), a driver circuit, a signal line, the flexible film 140 and the like can be disposed in the non-display area NA.

The plurality of flexible films 140 is disposed at one end of the substrate 110. The plurality of flexible films 140 is electrically connected to the non-display area NA of the substrate 110. Each of the plurality of flexible films 140 is a film in which various components are disposed on a base film having a malleability to supply a signal to the plurality of pixels PX. For example, the plurality of flexible films 140 can supply a data voltage or the like to plurality of pixels PX. Meanwhile, although four flexible films 140 are illustrated in FIG. 1, the number of the plurality of flexible films 140 can vary depending on the design and is not limited thereto.

The driver IC (integrated circuit), such as the gate driver IC, the data driver IC or the touch driver IC, can be disposed on each of the plurality of flexible films 140. The driver IC can be a component to process data for displaying images and a driving signal for processing the data. Further, the driver IC can process a touch driving signal and a touch sensing signal for sensing a touch.

The driver IC can be disposed by a chip on glass (COG), chip on film (COF) or tape carrier package (TCP) technique depending on a mounting method. However, for the convenience of description, the driver IC is described as being mounted on the plurality of flexible films 140 by the COF technique, but is not limited thereto.

The printed circuit board 150 is connected to the plurality of flexible films 140. The printed circuit board 150 can be a component to supply signals to the driver IC. In the printed circuit board 150, various components to supply various driving signals, such as a driving signal or a data signal, to the driver IC can be disposed. Meanwhile, although two printed circuit boards 150 are illustrated in FIG. 1, the number of printed circuit boards 150 can vary depending on the design and is not limited thereto.

Figure 3:
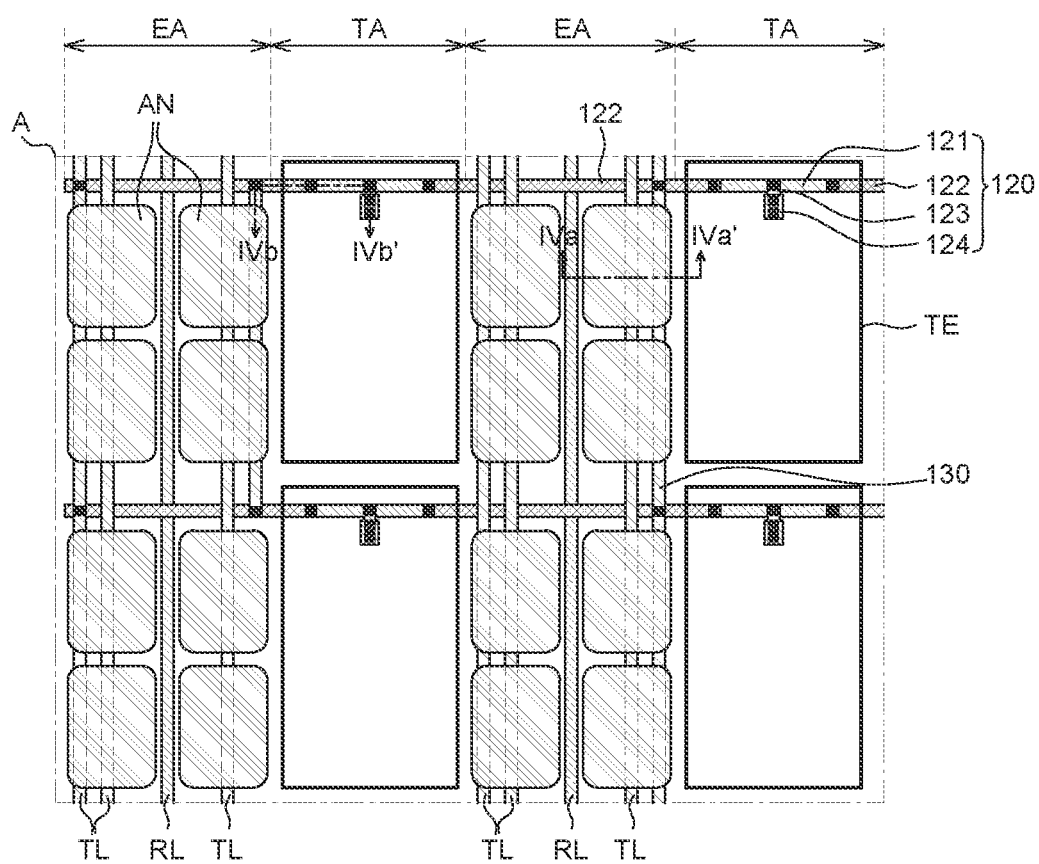
FIG. 3 is an enlarged view of an area A shown in FIG. 2.
Figure 4A:
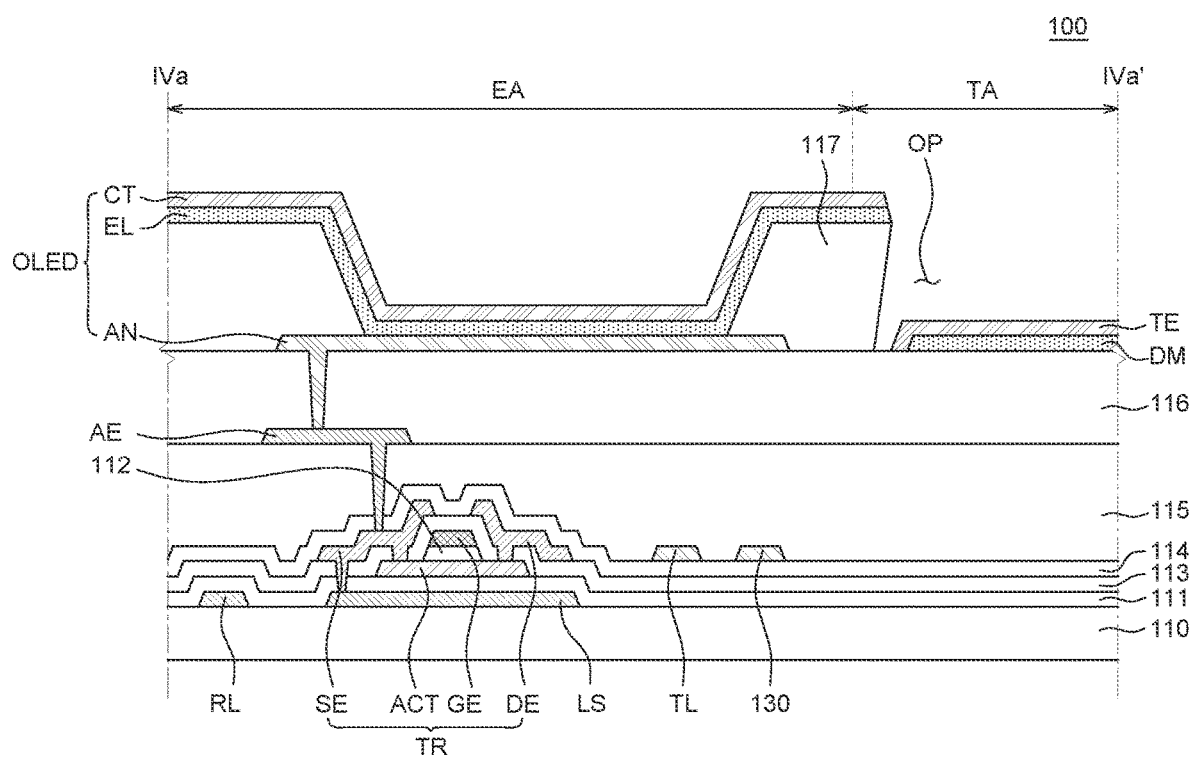
FIG. 4A is a cross-sectional view taken along a line IVa-IVa' of FIG. 3.
Figure 4B:
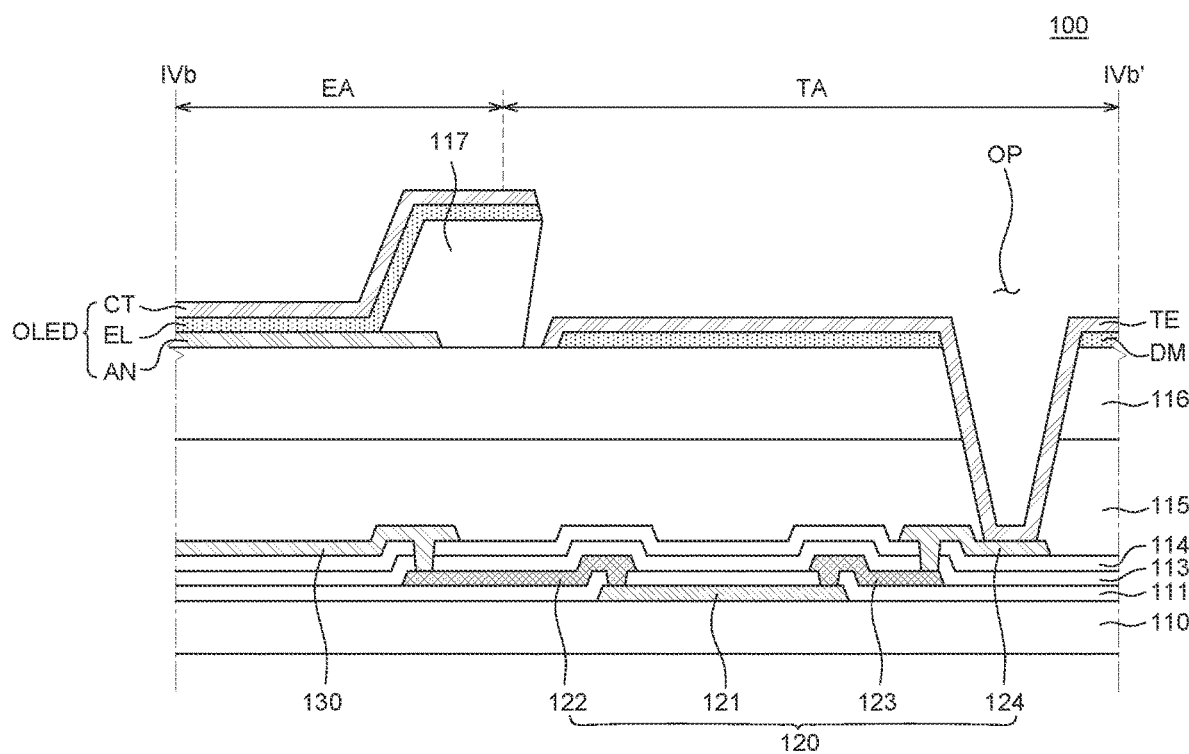
FIG. 4B is a cross-sectional view taken along a line IVb-IVb' of FIG. 3.

FIG. 3 is an enlarged view of an area A shown in FIG. 2. FIG. 4A is a cross-sectional view taken along a line IVa-IVa' of FIG. 3. FIG. 4B is a cross-sectional view taken along a line IVb-IVb' of FIG. 3. FIG. 3 can be an enlarged plan view of four pixels PX included in a touch electrode block TEB.

In FIG. 3, for the convenience of description, a plurality of reference lines RL, the plurality of touch lines TL, the plurality of first touch connection lines 120, the plurality of second touch connection lines 130, an anode AN and the touch electrode TE are illustrated. Also, the edges of the touch electrode TE are indicated by thick solid lines.

Hereinafter, for the convenience of description, an area where the plurality of sub-pixels SP is disposed in the pixel PX is defined as an emissive area EA. Also, an area where the touch electrode TE is disposed in the pixel PX is defined as a transmissive area TA. The emissive area EA can be defined as an area where the transmissive area TA is not disposed in the pixel PX. The emissive area EA can emit light through a light emitting diode OLED disposed in each of the plurality of sub-pixels SP.

The transmissive area TA can be an area through which at least a part of light incident from the outside is transmitted. In the transmissive area TA, the plurality of sub-pixels SP is not disposed. In the transmissive area TA, the touch electrode TE can be disposed. The transmissive area TA can be made of a transparent material. Specifically, a dummy organic layer DM and a plurality of insulating layers disposed in the transmissive area TA can be made of a transparent material. Accordingly, the display device 100 can have transparency due to the transmissive area TA.

The display device 100 is a transparent display device. The display device 100 can have transparency due to a plurality of transmissive areas TA and can also display an image through the emissive area EA. For example, the display device 100 can display an image, such as a video, a static image, a still cut or the like, as light is emitted through the emissive area EA. Also, the display device 100 can have transparency by transmitting light incident from the outside through the plurality of transmissive areas TA.

The display device 100 can be a top emission type display device. For the top emission type, light emitted from the light emitting diode OLED is emitted toward an upper portion of the substrate 110 on which the light emitting diode OLED is disposed. In the case of the top emission type, a reflective layer can be formed below the anode to allow the light emitted from the light emitting diode to travel to the upper portion of the substrate, i.e., toward the cathode.

Referring to FIG. 3 through FIG. 4B, the display device 100 according to an exemplary embodiment of the present disclosure includes the substrate 110, the plurality of reference lines RL, a light shielding layer LS, a transistor TR, the plurality of touch lines TL, the plurality of first touch connection lines 120, the plurality of second touch connection lines 130, the light emitting diode OLED and the touch electrode TE.

The plurality of reference lines RL, the light shielding layer LS, the transistor TR, the plurality of touch lines TL, the plurality of second touch connection lines 130 and the light emitting diode OLED are disposed in the emissive area EA. The plurality of anodes AN included in the emissive area EA can correspond to the plurality of sub-pixels SP, respectively. For example, two sub-pixels SP can be disposed on each of one side and the other side of the reference line RL within the single pixel PX.

In the transmissive area TA, the plurality of reference lines RL, the light shielding layer LS, the transistor TR, the plurality of touch lines TL, the plurality of second touch connection lines 130 and the light emitting diode OLED are not disposed. For example, the transmissive area TA needs to be configured to allow objects behind the display device 100 to be seen through the transmissive area TA. Therefore, the transmissive area TA needs to be configured to transmit light. Accordingly, the plurality of reference lines RL, the light shielding layer LS, the transistor TR, the plurality of touch lines TL, the plurality of second touch connection lines 130 and the light emitting diode OLED containing an opaque material are not disposed in the transmissive area TA. Thus, transparency or translucency of the transmissive area TA can be implemented.

Meanwhile, since the first touch connection line 120 is disposed in the first direction crossing the plurality of pixels PX, a part of the first touch connection line 120 can be disposed to pass through the transmissive area TA. However, an area overlapping with the first touch connection line 120 is just a part of the transmissive area TA. Therefore, the transmissive area TA can maintain transparency.

The plurality of reference lines RL and the light shielding layer LS are disposed on the substrate 110. The plurality of reference lines RL and the light shielding layer LS can be disposed in the emissive area EA. The plurality of reference lines RL and the light shielding layer LS can be made of the same material by the same process on the substrate 110. For example, the plurality of reference lines RL and the light shielding layer LS can be formed as a single layer or a multilayer of any one of molybdenum (Mo), copper (Cu), titanium (Ti), aluminum (Al), chromium (Cr), gold (Au), nickel (Ni) and neodymium (Nd) or an alloy thereof, but are not limited thereto.

The plurality of reference lines RL is configured to transfer a reference voltage to each of the plurality of sub-pixels SP. Each reference line RL can be extended from a central portion of the emissive area EA in the second direction. For example, the reference line RL can be disposed between two sub-pixels disposed on one side of the emissive area EA and two sub-pixels disposed on the other side. A plurality of sub-pixels SP forming a single pixel PX can share a single reference line RL. For example, a single reference line RL can transfer a reference voltage to each of four sub-pixels SP disposed in a single pixel PX.

The light shielding layer LS can be disposed to overlap with an active layer ACT of the transistor TR. The light shielding layer LS can be electrically connected to a source electrode SE, but is not limited thereto. When light is irradiated to the active layer ACT, a leakage current occurs. Therefore, the reliability of the transistor TR, which is a driving transistor, can decrease. Accordingly, if the light shielding layer LS made of an opaque conductive material is disposed to overlap with the active layer ACT, it is possible to block light incident to the active layer ACT from below the substrate 110. Also, the light shielding layer LS is applied with the same voltage as the source electrode SE and, thus, a constant parasitic capacitance between the light shielding layer LS and the active layer ACT can be maintained. Therefore, the reliability of the transistor TR can be improved by the light shielding layer LS.

A part of the plurality of first touch connection lines 120 is disposed on the substrate 110. Specifically, each of the plurality of first touch connection lines 120 includes a first sub-line 121, a second sub-line 122, a first sub-pattern 123 and a second sub-pattern 124. Herein, the first sub-line 121 can be disposed on the substrate 110. The first sub-line 121 can be made of the same material by the same process as the plurality of reference lines RL and the light shielding layer LS. For example, the first sub-line 121 can be formed as a single layer or a multilayer of any one of molybdenum (Mo), copper (Cu), titanium (Ti), aluminum (Al), chromium (Cr), gold (Au), nickel (Ni) and neodymium (Nd) or an alloy thereof, but is not limited thereto.

The first sub-line 121 can be disposed in the transmissive area TA. The first sub-line 121 can be disposed in the first direction. The first sub-line 121 can overlap with the touch electrode TE. The first sub-line 121 and the touch electrode TE overlapping with each other can be electrically connected to each other through the first sub-pattern 123 and the second sub-pattern 124 to be described later. Also, the first sub-line 121 can be electrically connected to the touch electrodes TE of pixels PX adjacent to each other in the first direction through the second sub-line 122 to be described later. For example, the plurality of first touch connection lines 120 can electrically connect the plurality of touch electrodes TE disposed in the first direction within the touch electrode block TEB.

A buffer layer 111 is disposed on the plurality of reference lines RL, the light shielding layer LS and the first sub-line 121. The buffer layer 111 is an insulating layer to be configured to insulate components on and under the buffer layer 111 and can be made of an insulating material. For example, the buffer layer 111 can be formed as a single layer of silicon oxide (SiOx) or silicon nitride (SiNx) or a multilayer thereof, but is not limited thereto. In the buffer layer 111, contact holes for contact between the second sub-line 122 and the first sub-line 121 and between the first sub-pattern 123 and the first sub-line 121 respectively are formed.

The transistor TR is disposed on the buffer layer 111. The transistor TR can be disposed in the emissive area EA. The transistor TR can be used as a driving element for driving the light emitting diode OLED. The transistor TR includes the active layer ACT, a gate electrode GE, the source electrode SE and the drain electrode DE. The transistor TR shown in FIG. 4A is a driving transistor and is a thin film transistor having a top gate structure where the gate electrode GE is disposed on the active layer ACT, but is not limited thereto. The transistor TR can also be implemented as a transistor having a bottom gate structure.

Meanwhile, FIG. 4A illustrates the driving transistor TR among various transistors included in the display device 100, but another transistor such as a switching transistor can be disposed on the buffer layer 111.

The active layer ACT is disposed on the buffer layer 111. The active layer ACT is an area where a channel is formed when the transistor TR is driven. The active layer ACT can be made of a semiconductor material such as an oxide semiconductor, amorphous silicon or polysilicon, but is not limited thereto. For example, when the active layer ACT is made of an oxide semiconductor, the active layer ACT is made up of a channel region, a source region and a drain region. Here, the source region and the drain region can be conductive regions, but are not limited thereto.

A gate insulating layer 112 is disposed on the active layer ACT. The gate insulating layer 112 is configured to electrically insulate the active layer ACT from the gate electrode GE and can be made of an insulating material. As shown in FIG. 4A, the gate insulating layer 112 can be patterned on the active layer ACT so as to have the same width as the gate electrode GE, but is not limited thereto. For example, the gate insulating layer 112 can be formed throughout the entire surface of the substrate 110. The gate insulating layer 112 can be formed as a single layer of silicon nitride (SiNx) or silicon oxide (SiOx) which is an inorganic material or a multilayer thereof, but is not limited thereto.

The gate electrode GE is disposed on the gate insulating layer 112. The gate electrode GE is disposed on the gate insulating layer 112 so as to overlap with the channel region of the active layer ACT. The gate electrode GE can be formed as a single layer or a multilayer of any one of various metal materials, for example, molybdenum (Mo), copper (Cu), titanium (Ti), aluminum (Al), chromium (Cr), gold (Au), nickel (Ni) and neodymium (Nd), or an alloy thereof, but is not limited thereto.

The second sub-line 122 and the first sub-pattern 123 is disposed on the buffer layer 111. The second sub-line 122 and the first sub-pattern 123 can be made of the same material by the same process as the gate electrode GE after patterning of the gate insulating layer 112. For example, the second sub-line 122 and the first sub-pattern 123 can be formed as a single layer or a multilayer of any one of molybdenum (Mo), copper (Cu), titanium (Ti), aluminum (Al), chromium (Cr), gold (Au), nickel (Ni) and neodymium (Nd), or an alloy thereof, but is not limited thereto.

The second sub-line 122 can be a line configured to electrically connect touch electrodes TE of pixels PX adjacent to each other in the first direction. The second sub-line 122 can be extended from the transmissive area TA to the emissive area EA in the first direction. The second sub-line 122 can be in contact with the first sub-line 121 in the transmissive area TA. One end portion and the other end portion of the second sub-line 122 can be electrically connected to the first sub-lines 121 of respective pixels PX adjacent to each other in the first direction.

Specifically, one end portion of the second sub-line 122 can be in contact with the first sub-line 121 disposed in the same pixel PX. The other end portion of the second sub-line 122 can be in contact with the first sub-line 121 disposed in a pixel PX adjacent in the first direction. Therefore, the second sub-line 122 can electrically connect the touch electrodes TE of the pixels PX adjacent to each other in the first direction.

The second sub-line 122 can intersect with the reference line RL extended in the second direction in the emissive area EA. For example, the second sub-line 122 and the reference line RL are disposed on different insulating layers and can overlap with each other. In this case, the reference line RL can be a line disposed on the same layer as the first sub-line 121. Therefore, the first sub-lines 121 disposed in the pixels PX adjacent to each other may not be affected by the reference line RL and can be electrically connected to each other through the second sub-line 122.

Meanwhile, as shown in FIG. 3, the second sub-line 122 of the pixel PX disposed on the outer side of the touch electrode block TEB may not be extended to the outside of the touch electrode block TEB and can be cut off. For example, the first touch connection line 120 can be a line configured to electrically connect the plurality of touch electrodes TE disposed in the first direction within the touch electrode block TEB. Accordingly, the second sub-line 122 on the outer side of the touch electrode block TEB may not be extended toward an adjacent touch electrode block TEB.

The first sub-pattern 123 can be disposed in the transmissive area TA. The first sub-pattern 123 can overlap with the first sub-line 121 and the touch electrode TE. One end portion and the other portion of the first sub-pattern 123 can be in contact with the first sub-line 121 and the touch electrode TE, respectively. For example, the first sub-pattern 123 can electrically connect the first sub-line 121 and the touch electrode TE through the second sub-pattern 124 to be described later.

An interlayer insulating layer 113 is disposed on the gate electrode GE, the second sub-line 122 and the first sub-pattern 123. The interlayer insulating layer 113 can be formed as a single layer of silicon nitride (SiNx) or silicon oxide (SiOx) which is an inorganic material or a multilayer thereof, but is not limited thereto. In the interlayer insulating layer 113, contact holes for contact between the source electrode SE and the source region of the active layer ACT and between the drain electrode DE and the drain region of the active layer ACT respectively are formed. Also, in the interlayer insulating layer 113, contact holes for contact between the second sub-pattern 124 and the first sub-pattern 123 and between the second touch connection line 130 and the second sub-line 122 respectively are formed.

The source electrode SE and the drain electrode DE are disposed on the interlayer insulating layer 113. The source electrode SE and the drain electrode DE are disposed on the same layer and are spaced apart from each other. The source electrode SE and the drain electrode DE are electrically connected to the active layer ACT through the contact holes in the interlayer insulating layer 113. The source electrode SE and the drain electrode DE can be formed as a single layer or a multilayer of any one of molybdenum (Mo), copper (Cu), titanium (Ti), aluminum (Al), chromium (Cr), gold (Au), nickel (Ni) and neodymium (Nd) or an alloy thereof, but are not limited thereto.

A passivation layer 114 is disposed on the source electrode SE and the drain electrode DE. The passivation layer 114 can be formed as a single layer of silicon nitride (SiNx) or silicon oxide (SiOx) which is an inorganic material or a multilayer thereof, but is not limited thereto. In the passivation layer 114, a contact hole for contact between the source electrode SE and an auxiliary electrode AE can be formed. Also, in the passivation layer 114, the contact holes for contact between the second sub-pattern 124 and the first sub-pattern 123 and between the second touch connection line 130 and the second sub-line 122 respectively are formed.

The plurality of touch lines TL, the second sub-pattern 124 and the plurality of second touch connection lines 130 are disposed on the passivation layer 114. The plurality of touch lines TL, the second sub-pattern 124 and the plurality of second touch connection lines 130 can be made of the same material by the same process on the passivation layer 114. For example, the plurality of touch lines TL, the second sub-pattern 124 and the plurality of second touch connection lines 130 can be formed as a single layer or a multilayer of any one of molybdenum (Mo), copper (Cu), titanium (Ti), aluminum (Al), chromium (Cr), gold (Au), nickel (Ni) and neodymium (Nd) or an alloy thereof, but are not limited thereto.

The plurality of touch lines TL applies a touch scan signal to the plurality of touch electrodes TE and receives a touch sensing signal from the plurality of touch electrodes TE. The plurality of touch lines TL can be extended in the second direction in the emissive area EA. The plurality of touch lines TL can be electrically connected to different touch electrode blocks TEB, respectively. For example, one of the plurality of touch lines TL can be electrically connected to all the touch electrodes TE disposed in one of the plurality of touch electrode blocks TEB. For example, as shown in FIG. 3, the touch line TL disposed on the leftmost side can be in contact with the second sub-line 122 of the touch electrode block TEB. Accordingly, the touch line TL can be electrically connected to all the touch electrodes TE within the touch electrode block TEB.

Meanwhile, FIG. 3 illustrates that three touch lines TL are disposed in a single pixel PX. For example, two touch lines TL can be disposed to overlap with sub-pixels SP on one side of the reference line RL and the other touch line TL can be disposed to overlap with sub-pixels SP on the other side of the reference line RL. However, the present disclosure is not limited thereto. The number of touch lines TL overlapping with a single pixel PX can vary depending on the design of the display device 100. Also, FIG. 3 illustrates that the leftmost touch line TL is electrically connected to the touch electrode block TEB, but the present disclosure is not limited thereto.

The second sub-pattern 124 can be disposed in the transmissive area TA. The second sub-pattern 124 can overlap with the first sub-pattern 123 and the touch electrode TE. One end portion and the other end portion of the second sub-pattern 124 can be in contact with the first sub-pattern 123 and the touch electrode TE, respectively. For example, the second sub-pattern 124 can electrically connect the first sub-line 121 and the touch electrode TE through the first sub-pattern 123.

The plurality of second touch connection lines 130 can be configured to electrically connect touch electrodes TE of pixels PX adjacent to each other in the second direction. The plurality of second touch connection lines 130 can be disposed adjacent to one of the plurality of touch lines TL in the emissive area EA. The plurality of second touch connection lines 130 can be extended in the second direction and can intersect with the plurality of the second sub-line 122 extended in the first direction. Each of the plurality of second touch connection lines 130 can be in contact with the second sub-lines 122 of the pixels PX disposed in the second direction.

Specifically, each second touch connection line 130 can be in contact with the plurality of second sub-line 122 which overlaps with the second touch connection line 130. Herein, the second sub-line 122 is electrically connected to the touch electrode TE through the first sub-line 121. Therefore, the plurality of second touch connection lines 130 can electrically connect the plurality of touch electrodes TE disposed in the second direction within the touch electrode block TEB.

A first planarization layer 115 is disposed on the plurality of touch lines TL, the second sub-pattern 124 and the plurality of second touch connection lines 130. The first planarization layer 115 is an insulating layer configured to planarize an upper portion of the substrate 110. The first planarization layer 115 can be made of an organic material, and can be formed as a single layer of, for example, polyimide or photo acryl or a multilayer thereof, but is not limited thereto. In the first planarization layer 115, a contact hole for contact between the auxiliary electrode AE and the source electrode SE can be formed.

The auxiliary electrode AE is disposed on the first planarization layer 115. The auxiliary electrode AE can serve to electrically connect the transistor TR and the light emitting diode OLED. The auxiliary electrode AE is electrically connected to the source electrode SE of the transistor TR through the contact hole formed in the first planarization layer 115. The auxiliary electrode AE can be formed as a single layer or a multilayer of any one of molybdenum (Mo), copper (Cu), titanium (Ti), aluminum (Al), chromium (Cr), gold (Au), nickel (Ni) and neodymium (Nd) or an alloy thereof, but is not limited thereto.

A second planarization layer 116 is disposed on the auxiliary electrode AE. The second planarization layer 116 is an insulating layer configured to planarize an upper portion of the first planarization layer 115. The second planarization layer 116 can be made of an organic material, and can be formed as a single layer of, for example, polyimide or photo acryl or a multilayer thereof, but is not limited thereto. In the second planarization layer 116, a contact hole for contact between the anode AN and the auxiliary electrode AE can be formed.

The light emitting diode OLED is disposed on the second planarization layer 116. The light emitting diode OLED can be disposed the emissive area EA. The light emitting diode OLED can be disposed in each of the plurality of sub-pixels SP. The light emitting diode OLED includes the anode AN, an emission layer EL and a cathode CT.

The anode AN is disposed on the second planarization layer 116 so as to correspond to each of the plurality of sub-pixels SP. The anode AN is disposed only in the emissive area EA, but is not disposed in the transmissive area TA. The anode AN can be electrically connected to the auxiliary electrode AE through the contact hole formed in the second planarization layer 116. Accordingly, the anode AN can be electrically connected to the source electrode SE of the transistor TR through the auxiliary electrode AE. However, the anode AN can also be electrically connected to the drain electrode DE of the transistor TR depending on the type of the transistor TR and the design method of the driver circuit.

The anode AN can be made of a conductive material having a high work function to supply holes to the emission layer EL. For example, the anode AN can be formed to have a multilayered structure including a transparent conductive layer and an opaque conductive layer having high reflection efficiency. The transparent conductive layer can be made of a material having a relatively high work function value, such as indium tin oxide (ITO) or indium zinc oxide (IZO). The opaque conductive layer can be formed as a single layer or a multilayer containing Al, Ag, Cu, Pb, Mo, Ti or an alloy thereof. However, the material of the anode AN is not limited thereto.

A bank 117 is disposed on the anode AN and the second planarization layer 116. The bank 117 can be formed on the second planarization layer 116 so as to cover an edge of the anode AN. The bank 117 is an insulating layer disposed between the plurality of sub-pixels SP to distinguish the plurality of sub-pixels SP. The bank 117 can be disposed at a boundary between sub-pixels SP adjacent to each other to suppress mixing of colors of light emitted from the light emitting diodes OLED of the sub-pixels SP, respectively. The bank 117 can be made of an organic insulating material. For example, the bank 117 can be made of one of an acrylic-based resin, an epoxy resin, a phenol resin, a polyamide-based resin, a polyimide-based resin, an unsaturated polyester-based resin, a polyphenylene-based resin, a polyphenylene sulfide-based resin, benzocyclobutene and photoresist, but is not limited thereto.

The bank 117 can be disposed at a boundary between the emissive area EA and the transmissive area TA to distinguish the emissive area EA and the transmissive area TA. The bank 117 can include an opening OP corresponding to the transmissive area TA. The opening OP can expose a part of the second planarization layer 116. Herein, the opening OP in transmissive area TA can increase in width from top to bottom. For example, an upper portion of the bank 117 can further protrude toward the opening OP than a lower portion of the bank 117. Accordingly, an under-cut region can be formed under the opening OP adjacent to the bank 117 by the protruding upper portion of the bank 117. The emission layer EL and the cathode CT can be cut off by the under-cut region at a region corresponding to the opening OP.

The emission layer EL is disposed on the anode AN and the bank 117. The emission layer EL can be formed throughout the entire surface of the substrate 110. For example, the emission layer EL can be a common layer commonly formed in the plurality of sub-pixels SP. The emission layer EL can be an organic layer for emitting light of a specific color. For example, the emission layer EL can be one of a red emission layer, a green emission layer, a blue emission layer and a white emission layer. If the emission layer EL is a white emission layer, a color filter can be further disposed on the light emitting diode OLED. The emission layer EL can further include various layer such as a hole transport layer, a hole injection layer, a hole blocking layer, an electron injection layer, an electron blocking layer, an electron transport layer and the like.

The cathode CT is disposed on the emission layer EL. The cathode CT can be formed throughout the entire surface of the substrate 110. For example, the cathode CT can be a common layer commonly formed in the plurality of sub-pixels SP. The cathode CT supplies electrons to the emission layer EL and thus can be made of a conductive material having a low work function. The cathode CT can be made of, for example, a transparent conductive material such as indium tin oxide (ITO) or indium zinc oxide (IZO), a metal alloy such as MgAg, or an ytterbium (Yb) alloy. The cathode CT can further include a metal doping layer, but is not limited thereto.

Meanwhile, since the emission layer EL and the cathode CT are formed throughout the entire surface of the substrate 110, a part of the emission layer EL and a part of the cathode CT can also be disposed in the transmissive area TA. For example, a part of the emission layer EL and a part of the cathode CT can be disposed on the bank 117 in the transmissive area TA.

The dummy organic layer DM is disposed within the opening OP of the bank 117. For example, the dummy organic layer DM is disposed in the transmissive area TA. The dummy organic layer DM can be disposed on the second planarization layer 116. The dummy organic layer DM can be made of the same material by the same process as the emission layer EL. Herein, the dummy organic layer DM and the emission layer EL are spaced apart from each other and thus can be electrically insulated from each other.

The touch electrode TE is disposed within the opening OP of the bank 117. For example, the touch electrode TE is disposed in the transmissive area TA. The touch electrode TE can be disposed to cover the dummy organic layer DM. The touch electrode TE can be made of the same material by the same process as the cathode CT. Herein, the touch electrode TE and the cathode CT are spaced apart from each other and thus can be electrically insulated from each other.

The opening OP of the bank 117 can include the under-cut region. For example, the upper portion of the bank 117 in the transmissive area TA can further protrude toward the opening OP than the lower portion of the bank 117. Therefore, the opening OP can include the under-cut region hidden by the protruding upper portion of the bank 117. When the emission layer EL and the cathode CT are deposited throughout the entire surface of the substrate 110, it is difficult to deposit the emission layer EL and the cathode CT on the under-cut region. Accordingly, the emission layer EL and the cathode CT can be discontinuously disposed at a region corresponding to the opening OP in the transmissive area TA. For example, when the emission layer EL is deposited, the dummy organic layer DM made of the same material as the emission layer EL can be disposed within the opening OP. The emission layer EL and the dummy organic layer DM can be cut off from each other. Also, when the cathode CT is deposited, the touch electrode TE made of the same material as the cathode CT can be disposed within the opening OP. The cathode CT and the touch electrode TE can be cut off from each other.

Meanwhile, it has been described in the present disclosure that the opening OP corresponding to the transmissive area TA is formed in the bank 117. However, the present disclosure is not limited thereto. For example, the opening OP can be formed in the transmissive area TA of the first planarization layer 115 or the second planarization layer 116.

In general, an add-on film type or a touch-on encapsulation (TOE: Touch on Encapsulation) type has been used as a touch technique used for display devices. According to the add-on film type, a touch panel is formed on a film, which incurs the additional material cost and processing cost. Also, a touch pattern is formed on the film, which can cause a decrease in transmittance and definition of the display device. According to the TOE type, at least four photomasks are needed to form a touch structure, and, thus, separate equipment for producing the photomasks is needed. Also, separate layers for forming the touch structure are added, which can cause a decrease in transmittance. Therefore, the TOE type may not be suitable for a transparent display device.

The display device 100 according to an exemplary embodiment of the present disclosure can be a transparent display device 100 having an in-cell touch structure. Specifically, each of the plurality of pixels PX can be divided into the emissive area EA including the plurality of sub-pixels SP and the transmissive area TA where the touch electrode TE is disposed. In the transmissive area TA, components of the sub-pixels SP containing an opaque material are not disposed, but the touch electrode TE made of a transparent conductive material is disposed. Accordingly, the display device 100 can have transparency due to the transmissive area TA.

The plurality of pixels PX can be divided into a plurality of areas and can form the plurality of touch electrode blocks TEB. The plurality of touch electrodes TE in a single touch electrode block TEB can be electrically connected to each other by the first touch connection line 120 and the second touch connection line 130. In this case, the first touch connection line 120 can be a line configured to electrically connect the plurality of touch electrodes TE disposed in the first direction. The second touch connection line 130 can be a line configured to electrically connect the plurality of touch electrodes TE disposed in the second direction. Also, the plurality of touch electrode blocks TEB can be electrically connected to the plurality of touch lines TL, respectively, and can transmit and receive a touch driving signal or a touch sensing signal. Accordingly, the display device 100 can recognize a touch through the plurality of touch electrode blocks TEB by the self-capacitance type method.

A touch structure of the display device 100 is not separately formed, but can be formed together with other components within the display device 100 by a continuous process. For example, the elements in the touch structure can be formed together with other elements in the display device 100 other than those in the touch structure meantime by the same process, respectively. Specifically, the plurality of touch electrode TE can be formed by the same process as the cathode CT. For example, an under-cut region is formed at the opening in the bank 117 corresponding to the transmissive area TA, and, thus, the cathode CT and the touch electrode TE cut off from each other can be formed simultaneously.

The first sub-line 121 of the first touch connection line 120 can be formed by the same process as the plurality of reference lines RL and the light shielding layer LS. The second sub-line 122 and the first sub-pattern 123 of the first touch connection line 120 can be formed by the same process as the gate electrode GE. The second sub-pattern 124 of the first touch connection line 120, the second touch connection line 130 and the plurality of touch lines TL can be formed by the same process. In this case, the second sub-pattern 124, the second touch connection line 130 and the plurality of touch lines TL can be disposed between the passivation layer 114 covering the source electrode SE and the drain electrode DE and the first planarization layer 115 for planarizing the upper portion of the substrate 110. Accordingly, the touch structure can be implemented within the display device 100 by a simple process with minimum cost.

Also, since the touch structure is implemented together with other components within the display device 100, the display device 100 can be slimmed and the transparency thereof can be further improved.

Each of the plurality of touch electrode blocks TEB can be configured having a cross shape. Accordingly, each touch electrode block TEB can increase in length in the first direction and the second direction compared to a square touch electrode block having the same area. Therefore, the coverage of a touch area which can be sensed by a single touch electrode block TEB can increase. Accordingly, the accuracy in touch sensing of the display device 100 can be improved. However, the shape of the plurality of touch electrode blocks TEB is not limited to the cross shape and can vary depending on the design of the display device 100.

Figure 5:
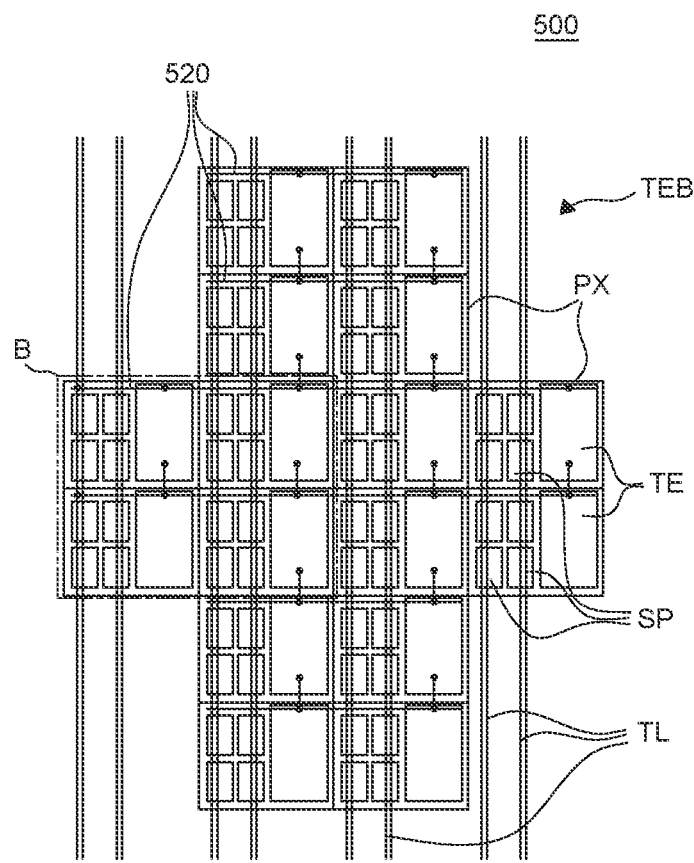
FIG. 5 is a configuration diagram illustrating a touch electrode block of a display device according to another exemplary embodiment of the present disclosure.
Figure 6:
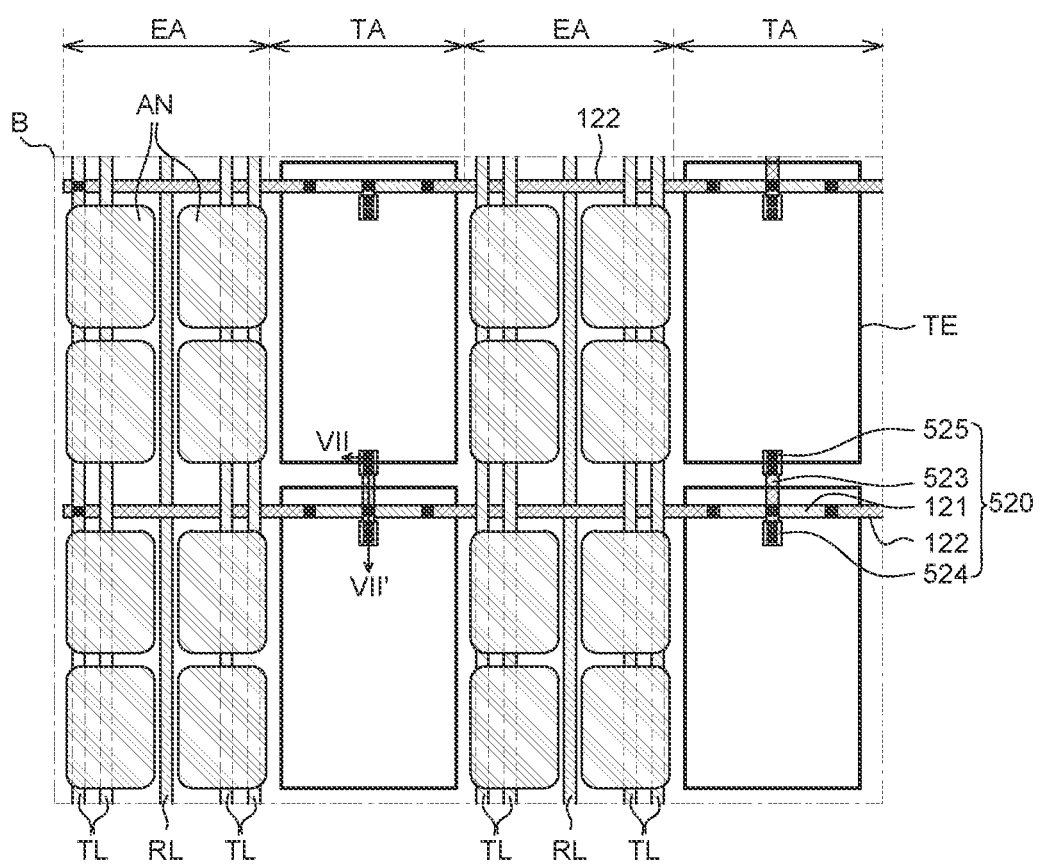
FIG. 6 is an enlarged view of an area B shown in FIG. 5.
Figure 7:
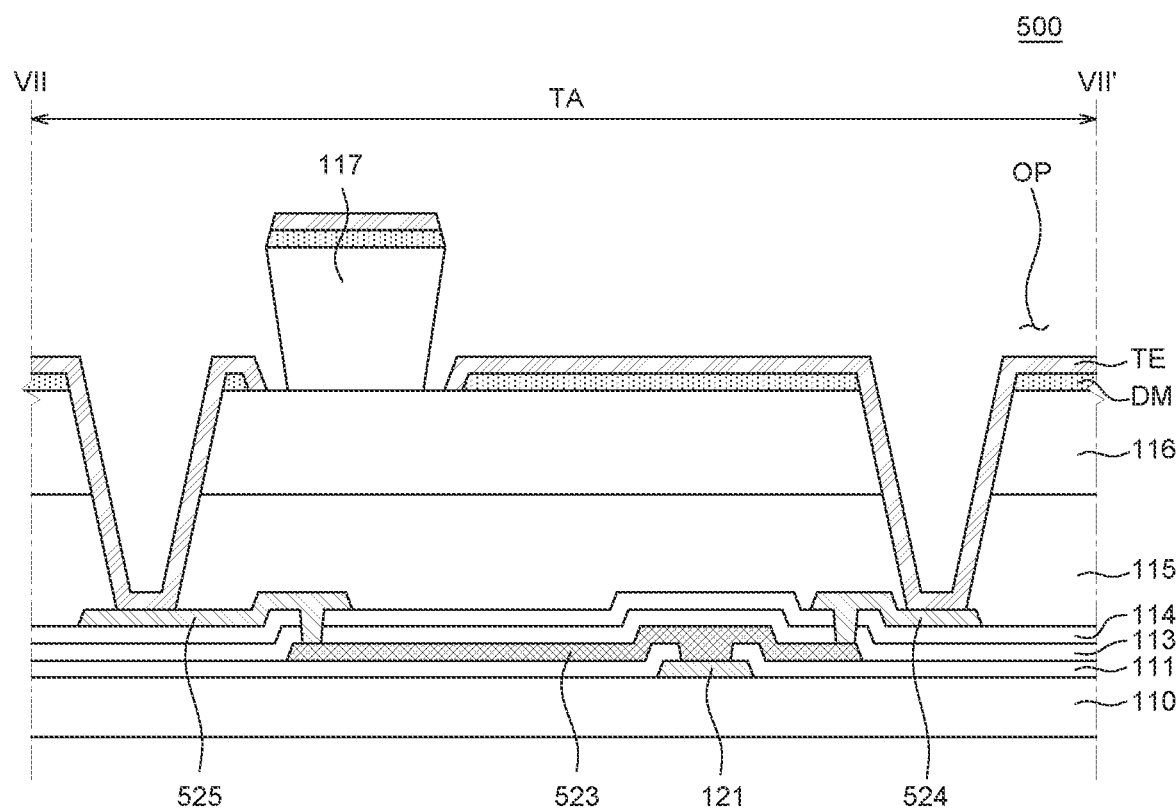
FIG. 7 is a cross-sectional view as taken along a line VII-VII' of FIG. 6.

FIG. 5 is a configuration diagram illustrating a touch electrode block of a display device according to another exemplary embodiment of the present disclosure. FIG. 6 is an enlarged view of an area B shown in FIG. 5. FIG. 7 is a cross-sectional view as taken along a line VII-VII' of FIG. 6.

In FIG. 5, for the convenience of description, one of the plurality of touch electrode blocks TEB of a display device 500 is illustrated. FIG. 6 can be an enlarged plan view of four pixels PX included in a touch electrode block TEB. In FIG. 6, for the convenience of description, the plurality of reference lines RL, the plurality of touch lines TL, a plurality of touch connection lines 520, the anode AN and the touch electrode TE are illustrated. Also, the edges of the touch electrode TE are indicated by thick solid lines.

Referring to FIG. 5 through FIG. 7, the display device 500 according to another exemplary embodiment of the present disclosure includes the substrate 110, the plurality of reference lines RL, the plurality of touch lines TL, the plurality of touch connection lines 520, the anode AN of the light emitting diode OLED, the dummy organic layer DM and the touch electrode TE. The display device 500 shown in FIG. 5 through FIG. 7 is substantially the same as the display device 100 shown in FIG. 1 through FIG. 4B except, for example, the plurality of touch lines TL and the plurality of touch connection lines 520. Therefore, a redundant description thereof will be omitted or may be briefly discussed.

The plurality of touch connection lines 520 includes the first sub-line 121, the second sub-line 122, a third sub-line 523, a first sub-pattern 524 and a second sub-pattern 525.

The first sub-line 121 can be disposed on the substrate 110. The first sub-line 121 can be made of the same material by the same process as the plurality of reference lines RL. The first sub-line 121 can be disposed in the first direction in the transmissive area TA. The first sub-line 121 can overlap with the touch electrode TE. The first sub-line 121 and the touch electrode TE overlapping with each other can be electrically connected to each other through the third sub-line 523 and the first sub-pattern 524.

The second sub-line 122 can be extended from the first sub-line 121 to the emissive area EA in the first direction. The second sub-line 122 is disposed on the buffer layer 111 covering the plurality of reference lines RL and the first sub-line 121. The second sub-line 122 can intersect with the reference line RL in the emissive area EA. The second sub-line 122 can be in contact with the first sub-line 121 in the transmissive area TA. One end portion and the other end portion of the second sub-line 122 can be electrically connected to the first sub-lines 121 of respective pixels PX adjacent to each other in the first direction. Accordingly, the second sub-line 122 can electrically connect the touch electrodes TE of the pixels PX adjacent to each other in the first direction.

The third sub-line 523 can be a line configured to electrically connect touch electrodes TE of pixels PX adjacent to each other in the second direction. The third sub-line 523 is disposed on the buffer layer 111. For example, the third sub-line 523 can be made of the same material by the same process as the gate electrode GE and the second sub-line 122. For example, the third sub-line 523 can be formed as a single layer or a multilayer of any one of molybdenum (Mo), copper (Cu), titanium (Ti), aluminum (Al), chromium (Cr), gold (Au), nickel (Ni) and neodymium (Nd) or an alloy thereof, but is not limited thereto.

The third sub-line 523 is disposed in the second direction in the transmissive area TA. The third sub-line 523 can intersect with the first sub-line 121. The third sub-line 523 can be in contact with the first sub-line 121 through the contact hole formed in the buffer layer 111. One end portion and the other end portion of the third sub-line 523 can be electrically connected to the touch electrodes TE of respective pixels PX adjacent to each other in the second direction. Specifically, one end portion of the third sub-line 523 can be electrically connected to the touch electrode TE disposed in the same pixel PX. The other end portion of the third sub-line 523 can be electrically connected to the touch electrode TE disposed in a pixel PX adjacent in the second direction. In this case, the third sub-line 523 and the touch electrode TE can be electrically connected to each other through the first sub-pattern 524 or the second sub-pattern 525. Therefore, the third sub-line 523 can electrically connect the touch electrodes TE of the pixels PX adjacent to each other in the second direction.

The first sub-pattern 524 and the second sub-pattern 525 are disposed on the passivation layer 114 in the transmissive area TA. The first sub-pattern 524 and the second sub-pattern 525 can be made of the same material by the same process as the plurality of touch lines TL. For example, the first sub-pattern 524 and the second sub-pattern 525 can be formed as a single layer or a multilayer of any one of molybdenum (Mo), copper (Cu), titanium (Ti), aluminum (Al), chromium (Cr), gold (Au), nickel (Ni) and neodymium (Nd) or an alloy thereof, but are not limited thereto.

The first sub-pattern 524 can overlap with the third sub-line 523 and the touch electrode TE. One end portion and the other portion of the first sub-pattern 524 can be in contact with the third sub-line 523 and the touch electrode TE, respectively. For example, the first sub-pattern 524 can electrically connect the first sub-line 121 and the touch electrode TE through the third sub-line 523. In other words, the first sub-pattern 524 can electrically connect the first sub-line 121 and the second sub-line 122 extended in the first direction to the plurality of touch electrodes TE disposed in the first direction.

The second sub-pattern 525 can overlap with the third sub-line 523 and the touch electrode TE. One end portion and the other end portion of the second sub-pattern 525 can be in contact with the third sub-line 523 and the touch electrode TE, respectively. For example, the second sub-pattern 525 can electrically connect the first sub-line 121 and the touch electrode TE through the third sub-line 523. In this case, the touch electrode TE in contact with the second sub-pattern 525 can be different from the touch electrode TE in contact with the first sub-pattern 524. Specifically, the first sub-pattern 524 and the second sub-pattern 525 in contact with a single third sub-line 523 can be in contact with different touch electrodes TE, respectively. In this case, the touch electrodes TE electrically connected to the first sub-pattern 524 and the second sub-pattern 525 can be touch electrodes TE of pixels PX adjacent to each other in the second direction. For example, the second sub-pattern 525 can electrically connect the plurality of touch electrodes TE disposed in the second direction through the third sub-line 523 extended in the second direction.

The plurality of touch lines TL can be disposed on the passivation layer 114 in the second direction. For example, the plurality of touch lines TL can be made of the same material by the same process as the first sub-pattern 524 and the second sub-pattern 525. Four touch lines TL can be disposed in the emissive area EA of a single pixel PX, but the present disclosure is not limited thereto. The plurality of touch lines TL can be electrically connected to different touch electrode blocks TEB, respectively. For example, one of the plurality of touch lines TL can be electrically connected to all the touch electrodes TE disposed in one of the plurality of touch electrode blocks TEB. For example, as shown in FIG. 5 and FIG. 6, the touch line TL disposed on the leftmost side can be in contact with the second sub-line 122 of the touch electrode block TEB. Accordingly, the touch line TL can be electrically connected to all the touch electrodes TE within the touch electrode block TEB.

In the display device 500 according to still another exemplary embodiment of the present disclosure, the touch electrodes TE disposed in the first direction can be electrically connected to each other through the first sub-line 121 and the second sub-line 122 extended in the first direction. Also, the touch electrodes TE disposed in the second direction can be electrically connected to each other through the third sub-line 523 disposed in the second direction. In this case, the first sub-line 121 can be disposed in the transmissive area TA, and the second sub-line 122 can be extended from the transmissive area TA to the emissive area EA. The third sub-line 523 can be extended from the touch electrode TE overlapping with the first sub-line 121 to a space between the touch electrodes TE adjacent to each other in the second direction.

Further, the third sub-line 523 can be electrically connected to the touch electrodes TE through the sub-patterns 524 and 525 in the transmissive area TA. For example, the touch connection lines 520 can electrically connect the touch electrodes TE adjacent to each other in the first direction and in the second direction in only a minimum space of the transmissive area TA. Therefore, in the display device 500 according to still another exemplary embodiment of the present disclosure, a sufficient space for designing components for driving sub-pixels SP disposed in the emissive area EA can be maintained and the transparency of the transmissive area TA can be secured.

The exemplary embodiments of the present disclosure can also be described as follows:

According to an aspect of the present disclosure, the display device can include a substrate in which a plurality of pixels each including an emissive area and a transmissive area is disposed. Also, the display device includes a touch electrode in the transmissive area. Further, the display device includes a plurality of first touch connection lines extended in a first direction and electrically connecting the touch electrodes respectively disposed in the plurality of pixels adjacent to each other. Furthermore, the display device includes a reference line on the substrate in the emissive area and extended in a second direction different from the first direction. Moreover, the display device includes a plurality of touch lines extended in the second direction in the emissive area and disposed on a plurality of insulating layers covering the reference line. Further, the display device includes a planarization layer covering the plurality of touch lines. Furthermore, the display device includes a plurality of light emitting diodes on the planarization layer in the emissive area. The touch electrode is disposed on the planarization layer, and the plurality of first touch connection lines is disposed under the planarization layer.

The plurality of first touch connection lines can be disposed crossing the emissive area and the transmissive area within the plurality of pixels.

The display device can further include a plurality of second touch connection lines on the same layer as the plurality of touch lines in the emissive area. The plurality of second touch connection lines can be extended in the second direction and can electrically connect the plurality of first touch connection lines respectively disposed in the plurality of pixels adjacent to each other.

The plurality of first touch connection lines can includes a first sub-line overlapping with the touch electrode in the transmissive area; and a second sub-line extended from the first sub-line and disposed in the emissive area. The first sub-line can be disposed on the same layer as the reference line, and the second sub-line can be disposed between the plurality of insulating layers.

The second sub-line and the reference line are disposed to intersect with each other in the emissive area.

One end portion and the other end portion of the second sub-line can be electrically connected to the first sub-lines disposed in the plurality of pixels, respectively, adjacent to each other in the first direction.

The touch electrode and the first sub-line overlapping with each other can be electrically connected to each other through a sub-pattern.

The sub-pattern can be disposed between the plurality of insulating layers or between the plurality of insulating layers and the planarization layer.

The display device can further include a third sub-line in contact with the first sub-line in the transmissive area. The third sub-line can be extended in the second direction on the same layer as the second sub-line.

One end portion and the other end portion of the third sub-line can be electrically connected to the touch electrodes disposed in the plurality of pixels, respectively, adjacent to each other in the second direction.

The third sub-line can be electrically connected to the touch electrode through a sub-pattern disposed on the plurality of insulating layers.

The display device can further include a plurality of touch electrode blocks each including some of the plurality of pixels. The plurality of touch electrode blocks can be electrically connected to the plurality of touch lines, respectively.

The plurality of touch lines can be electrically connected to one of the plurality of first touch connection lines disposed in the plurality of touch electrode blocks.

An anode of the plurality of light emitting diodes can be disposed only in the emissive area among the emissive area and the transmissive area.

The touch electrode and a cathode of the plurality of light emitting diodes can be made of the same material and spaced apart from each other.

The touch electrode and the cathode can be made of a transparent conductive material.

Although the exemplary embodiments of the present disclosure have been described in detail with reference to the accompanying drawings, the present disclosure is not limited thereto and can be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto.

Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:
a substrate in which a plurality of pixels is disposed, each of the plurality of pixels including an emissive area and a transmissive area;
a touch electrode in the transmissive area of each of the plurality of pixels;
a plurality of first touch connection lines extended in a first direction, and electrically connecting the touch electrodes respectively disposed in the plurality of pixels adjacent to each other;
a reference line on the substrate in the emissive area, and extended in a second direction different from the first direction;
a plurality of touch lines extended in the second direction in the emissive area, and disposed on a plurality of insulating layers covering the reference line;
a planarization layer covering the plurality of touch lines; and
a plurality of light emitting diodes on the planarization layer in the emissive area,
wherein the touch electrode is disposed on the planarization layer, and the plurality of first touch connection lines is disposed under the planarization layer.

2. The display device according to claim 1, wherein the plurality of first touch connection lines is disposed crossing the emissive area and the transmissive area within the plurality of pixels.

3. The display device according to claim 1, further comprising:
a plurality of second touch connection lines on a same layer as the plurality of touch lines in the emissive area,
wherein the plurality of second touch connection lines is extended in the second direction, and electrically connects the plurality of first touch connection lines respectively disposed in the plurality of pixels adjacent to each other.

4. The display device according to claim 1, wherein the plurality of first touch connection lines includes:
a first sub-line overlapping with the touch electrode in the transmissive area; and
a second sub-line extended from the first sub-line and disposed in the emissive area,
wherein the first sub-line is disposed on a same layer as the reference line, and the second sub-line is disposed between the plurality of insulating layers.

5. The display device according to claim 4, wherein the second sub-line and the reference line are disposed to intersect with each other in the emissive area.

6. The display device according to claim 4, wherein one end portion and another end portion of the second sub-line are electrically connected to the first sub-lines disposed in the plurality of pixels, respectively, adjacent to each other in the first direction.

7. The display device according to claim 4, wherein the touch electrode and the first sub-line overlapping with each other are electrically connected to each other through a sub-pattern.

8. The display device according to claim 7, wherein the sub-pattern is disposed between the plurality of insulating layers or between the plurality of insulating layers and the planarization layer.

9. The display device according to claim 4, further comprising:
a third sub-line in contact with the first sub-line in the transmissive area,
wherein the third sub-line is extended in the second direction on a same layer as the second sub-line.

10. The display device according to claim 9, wherein one end portion and another end portion of the third sub-line are electrically connected to the touch electrodes disposed in the plurality of pixels, respectively, adjacent to each other in the second direction.

11. The display device according to claim 10, wherein the third sub-line is electrically connected to the touch electrode through a sub-pattern disposed on the plurality of insulating layers.

12. The display device according to claim 1, further comprising:
a plurality of touch electrode blocks each including some of the plurality of pixels,
wherein the plurality of touch electrode blocks is electrically connected to the plurality of touch lines, respectively.

13. The display device according to claim 12, wherein the plurality of touch lines is electrically connected to one of the plurality of first touch connection lines disposed in the plurality of touch electrode blocks.

14. The display device according to claim 1, wherein an anode of the plurality of light emitting diodes is disposed only in the emissive area among the emissive area and the transmissive area.

15. The display device according to claim 1, wherein the touch electrode and a cathode of the plurality of light emitting diodes are made of a same material and are disposed spaced apart from each other.

16. The display device according to claim 15, wherein the touch electrode and the cathode are made of a transparent conductive material.

17. The display device according to claim 1, wherein a touch structure of the display device comprises the touch electrode, the plurality of first touch connection lines and the plurality of touch lines, and
wherein the touch structure is formed together with other elements other than the touch structure in the display device meantime by a same process, respectively.

18. The display device according to claim 17, wherein the touch electrode is formed by a same process as a cathode of the plurality of light emitting diodes.

19. The display device according to claim 17, wherein part of each of the plurality of first touch connection lines is formed by a same process as a gate electrode of a transistor electrically connected to the plurality of light emitting diodes.

\* \* \* \* \*